United States Patent [19]

Smith

[11] Patent Number: 5,420,746
[45] Date of Patent: May 30, 1995

[54] SINGLE ELECTRON DEVICE INCLUDING CLUSTERS OF PURE CARBON ATOMS

[75] Inventor: Doran C. Smith, Brick, N.J.

[73] Assignee: The United States of America as represented by the Secretary of the Army, Washington, D.C.

[21] Appl. No.: 46,535

[22] Filed: Apr. 13, 1993

[51] Int. Cl.⁶ .............................................. H01G 4/06
[52] U.S. Cl. .................................................... 361/311
[58] Field of Search ................ 361/311, 312, 321.1, 361/321.5; 423/445 B; 257/9, 37–40

[56] References Cited

U.S. PATENT DOCUMENTS

| 4,214,916 | 7/1980 | Felsher | 427/74 |
| 5,171,732 | 12/1992 | Hed | 257/31 |
| 5,178,980 | 1/1993 | Mort et al. | 430/58 |
| 5,331,183 | 7/1994 | Sariciftci | 257/40 |

FOREIGN PATENT DOCUMENTS 160450 6/1993 Japan .

OTHER PUBLICATIONS

R. Wilkins, et al., Phys. Rev. Lett. 63, 801 (1989).
E. A. Rohlfing, et al., J. Chem. Phys. 81, 3322 (1984).
H. W. Kroto, et al., Nature 318, 162 (1985).
W. Kratschmer, et al., Nature 347, 354 (1990).
Heiney, et al., Phys. Rev. Lett. 66, 2911 (1991).
Haddon, et al., Nature 350, 320 (1991).
A. F. Hebard, et al., Nature 350, 600 (1991).
J. P. McCauley, et al., J. Am. Chem. Soc. 113, 8537 (1991).
R. Baum, C&EN, p. 5. Oct. 21, 1991.
L. L. Chang, et al., Appl. Phys. Lett. 24, 593 (1974).
B. Su, et al., Appl. Phys. Lett. 58, 747 (1991).
L. Geerligs, et al., Phys. Rev. Lett. 64, 22 (1990).
Meirav, et al., Phys. Rev. Lett., 65, 771 (1990).
New York Times, Mar. 5, 1993, p. A18.

Primary Examiner—Mark H. Paschall
Assistant Examiner—Michael D. Switzer
Attorney, Agent, or Firm—Michael Zelenka; William H. Anderson

[57] ABSTRACT

A solid state electronic device using single electrons to convey information. A cluster of pure carbon atoms, commonly known as a fullerene, is used to trap a single electron tunneling through an insulating material located between conductive layers of the device.

9 Claims, 3 Drawing Sheets

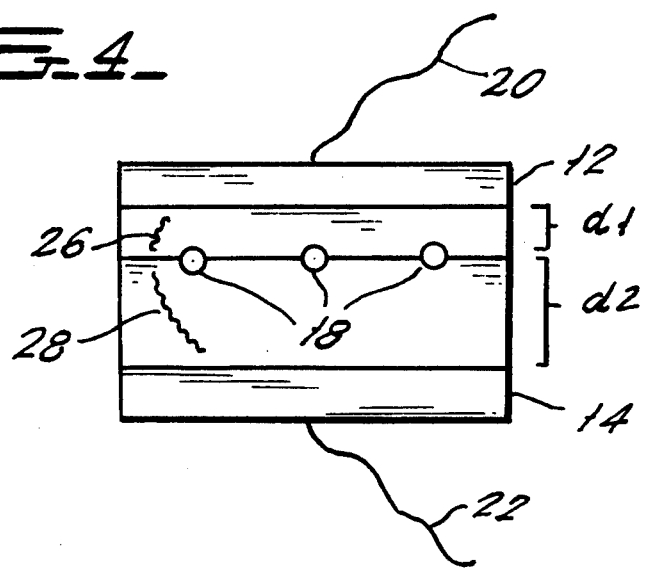
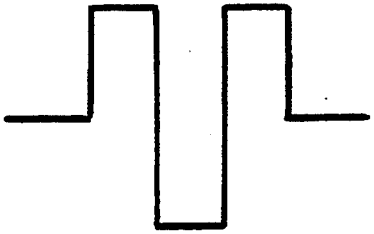
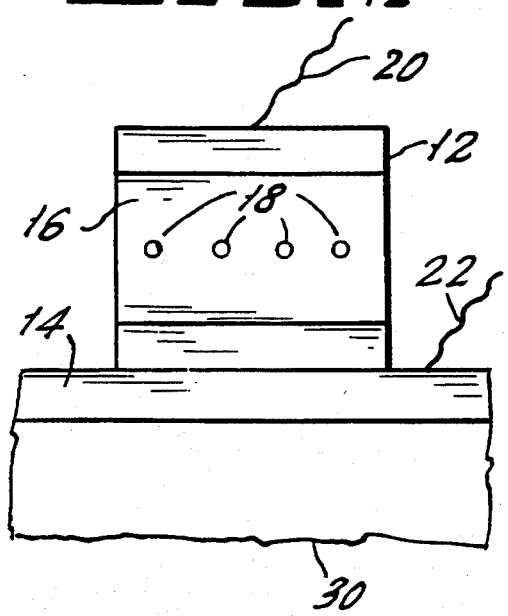
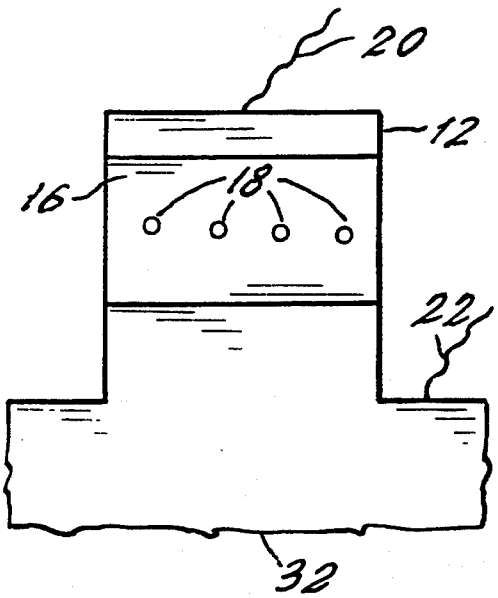

SINGLE ELECTRON DEVICE INCLUDING CLUSTERS OF PURE CARBON ATOMS

The invention described herein may be manufactured, used and licensed by or for the Government for Governmental purposes without the payment to me of any royalties thereon.

BACKGROUND OF THE INVENTION

1. Field of the Invention

The present invention relates to solid state electronics and, more particularly, solid state electronic devices which use a single electron to convey information.

2. Description of the Related Art

It is possible with modern fabrication techniques to construct capacitors so small that the charge of a single electron on one of the plates of the capacitor results in a measurable voltage being developed across the terminals of the capacitor. The smaller the capacitor, the larger the voltage. Current fabrication limits put the capacitor size at about $10 \times 10$ nm square, resulting in operating temperatures of 4K.

Since the presence of a single electron on a very small capacitor causes a finite voltage to develop across its terminals, it follows that a finite voltage, $e/2C$ (where e is the charge of a single electron, and C the capacitance of the capacitor) must be applied to the capacitor before the first electron will move onto the capacitor plates. This is referred to as "coulomb blockade". Because of the coulomb effects of a single electron on a tiny capacitor, current flow is blocked until a certain threshold voltage is reached.

Fullerenes are large pure carbon clusters including an even number of 32 or more carbon atoms. They were first experimentally discovered in 1985. See Rohlfing et al., J. Chem. Phys. 81, 3322 (1984) and Kroto et al. Nature, 318 162 (1985). The most stable fullerene is believed to be a fullerene containing sixty carbon atoms ("$C_{60}$") which is believed to have a structure like a soccer ball, i.e., a hollow sphere made up of 20 hexagons and 12 pentagons, arranged as a truncated icosahedron. A carbon atom is located at each vertex of the hexagons and pentagons. Gram size quantities of $C_{60}$ have been manufactured. See Kratschmer et al., Nature, 347, 354 (1990). $C_{60}$ is always exactly the same size. $C_{70}$ has also been observed in large quantities. It is believed that $C_{70}$ has a structure like a football. The diameter of $C_{60}$ is about 1 nm. See Heiney et al., Phys. Rev. Lett., 66, 2911 (1991). Both $C_{60}$ and $C_{70}$ can be made electrically conductive by alkali-metal-doping. See Haddon et al., Nature 350, 320 (1991). $C_{60}$ becomes superconductive when doped with potassium (See Hebard et al., Nature, 350, 600 (1991)) or rubidium (See McCauley et al., J. Am. Chem. Soc., 113, 8537 (1991).

The hollow nature of fullerenes makes it possible to trap atoms. In other words, atoms are trapped inside of carbon cages. This has been demonstrated with lanthanum atoms. One to four lanthanum atoms have been trapped inside varying size fullerenes. See Baum, Chem. & Eng. News, pg. 5, October 1991. Significant modification of the characteristics of fullerenes can be obtained by trapping atoms. Atoms can also be attached to the outside of fullerenes.

Conventional single electron devices utilize small metal balls or small regions of two dimensional electron gas confined by electrostatic forces. Both techniques, however, are not satisfactory. The smallest metal balls used to date have been approximately 10 nm in size. These 10 nm balls develop good signals at 4K but are not desirable for room temperature operation. The smallest two dimensional electron gas regions to date require operation at or below 1K.

Moreover, the metal balls and the regions are all slightly different in size due to fabrication variances. Current fabrication techniques, cannot obtain the size uniformity required for the use of these devices in large scale integrated circuits.

SUMMARY OF THE INVENTION

It is an object of the invention to increase the operating temperature of single electron devices.

Another object of the invention is to increase production yields of single electron devices by increasing device uniformity.

Yet another object of the invention is to provide a solid state electronic device which is operable at room temperature and which uses single electrons to carry information.

These objectives, and other objectives, are achieved by a solid state electronic device in accordance with the invention which includes first and second conductive layers and an insulating material located between the conductive layers, the insulating material including a cluster of pure carbon atoms. Each conductive layer includes a lead connected thereto. A single electron is conducted from one of the conductive layers to the other conductive layer through the pure carbon cluster during operation of the device. More specifically, a single electron tunnels from one of the conductive layers through the insulating material to the pure carbon cluster and then from the cluster to the other conductive layer. The pure carbon atom cluster may be a layer of pure carbon atom clusters, each cluster including 60 carbon atoms, and the cluster or clusters may be chemically modified to alter the energy band gap thereof. Preferably, each cluster of carbon atoms has a truncated icosahedron structure including 60 vertices and having 32 faces. Twelve of the faces have a pentagonal shape, and 20 of the faces have a hexagonal shape. The insulating material may be either silicon dioxide, barium fluoride, magnesium fluoride or combinations of these insulating materials.

The height of the energy conduction band of the insulating material may vary. A first insulating material having a first conduction energy band may be located between one of the conductive layers and the layer of pure carbon atom clusters. A second insulating material having a second conduction energy band which is different from the first conduction energy band of the first insulator, may be located between the pure carbon cluster and the second conductive layer. Alternatively, the amount of the first insulating material may be different from the amount of the second insulating material so that different conduction band energies exist above and below the pure carbon cluster. Preferably, the device includes a substrate, for mechanical support of the device. The substrate may also be electrically conductive.

Other features and advantages of the present invention will become apparent from the following description of the invention which refers to the accompanying drawings.

BRIEF DESCRIPTION OF THE DRAWINGS

FIG. 4 is a cross-sectional view of a second embodiment of a device in accordance with the invention including different insulating materials or different amounts of insulation in order to vary the conduction band of the insulating material.

FIGS. 6a–6b show two alternative conduction bands of the device of FIG. 4.

FIG. 7 shows a cross-sectional view of the device shown in FIG. 1 supported on a substrate.

FIG. 8 shows a cross-sectional view of the device shown in FIG. 1 on a substrate that is electrically conductive.

DETAILED DESCRIPTION OF THE PREFERRED EMBODIMENTS

Figure 1:
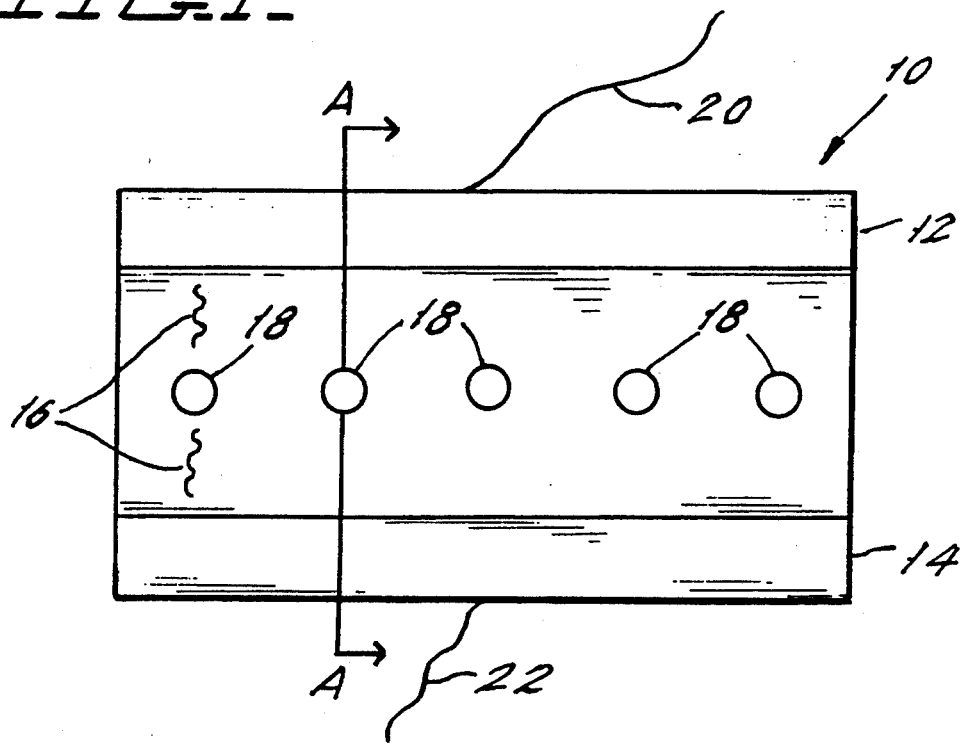
FIG. 1 is a cross-sectional view of a solid state electronic device in accordance with the invention.

Referring now to the drawings wherein like numbers indicate like elements, there is shown in FIG. 1 a device in accordance with the principles of the invention and designated generally as 10. Device 10 includes conductive layers 12 and 14 which are ohmic and insulating material 16 located between layers 12 and 14. Leads 20, 22 are connected to conductive layers 12, 14, respectively. A layer of clusters of pure carbon atoms 18 is located within insulator material 16. It will be appreciated that only one cluster 18 is necessary for the invention. Insulating material 16 may be any suitable insulating material having favorable conduction band lineup with respect to fullerenes 18. Insulating material 16 can be either silicon dioxide, barium fluoride or magnesium fluoride. Other suitable insulating materials will be apparent to one skilled in the art.

Figure 2:
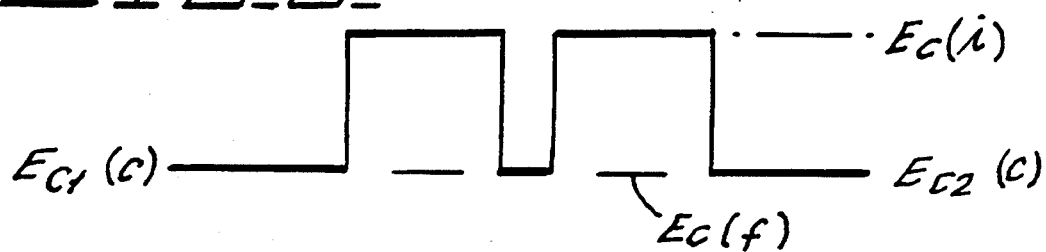
FIG. 2 shows the conduction band of the electron device of FIG. 1 along line A—A, which passes through the center of one of the fullerenes.

Referring now to FIG. 2, there is shown the conduction band of device 10 along a line A—A of device 10. Ec1(c) and Ec2(c) refer to the conduction band energy in conductive layers 12 and 14, respectively. Ec(i) refers to the conduction band energy of insulating material 16. Ec(f) refers to the conduction band energy in fullerene 18.

Operation of device 10 is similar to that of a double barrier tunnel structure where the central region formed by fullerene 18 is so small that the tunnel current will experience a coulomb blockade effect, as discussed above. Operation of double barrier tunnel structures are well known. See Chang et al., App. Phy. Lett., 24, 593 (1974), which is herein incorporated by reference.

Although the invention has been described in terms of conduction bands and electrons, it will be understood that the invention may readily be described in terms of valance bands and holes.

Figure 3:
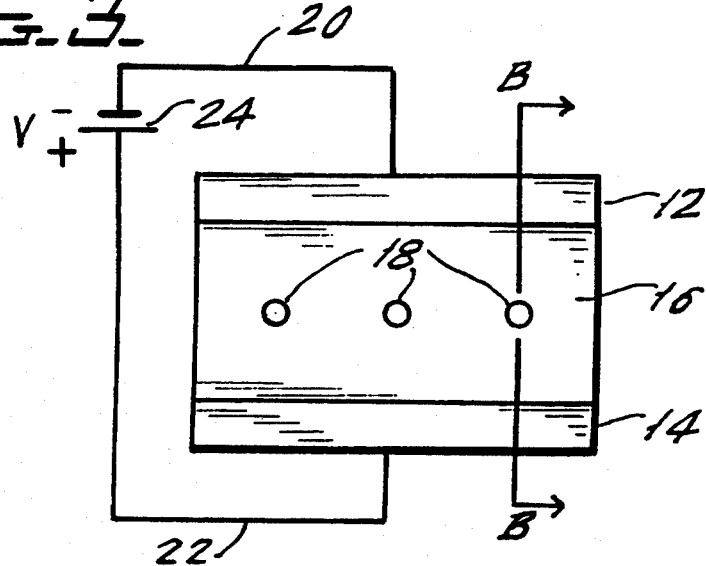
FIG. 3 is a cross-sectional view of the device of FIG. 1 connected to a two terminal voltage source.
Figure 3A:
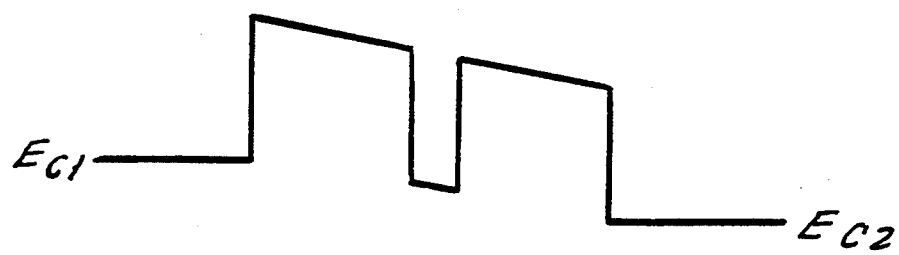
FIG. 3a shows the conduction band of the device of FIG. 3. along line B—B, which passes through the center of one of the fullerenes.

In a symmetrical structure, as shown in FIG. 2, the direction of current flow does not matter. The structure may be biased by battery 24 (FIG. 3) at a voltage so that electrons tend to flow from conductive layer 12 at Ec1, to conductive layer 14 at Ec2 as shown in FIG. 3a. Under low bias, i.e., below a certain critical voltage which is dependent upon the design details of device 10, for example, the thickness of insulating material 16, no current will flow because the charging voltage of fullerene 18 is greater than the bias applied. Preferably, the order of magnitude of this voltage is about 1 V. In other words, there is a coulomb blocking effect which prevents an electron from tunneling through insulating material 16 toward fullerene 18. Once the critical voltage is obtained, one electron leaves conductive layer 12 and tunnels through insulator 16 into fullerene 18, and then similarly exits fullerene 18 and continues tunneling through insulator 16 into conductive layer 14. The charging voltage of two electrons on fullerene 18 is greater than the charging voltage of a single electron. Therefore, if the voltage applied to device 10 is maintained above a charging voltage of a single electron, but below the charging voltage of two electrons, only one electron at a time will be on fullerene 18.

Figure 3B:
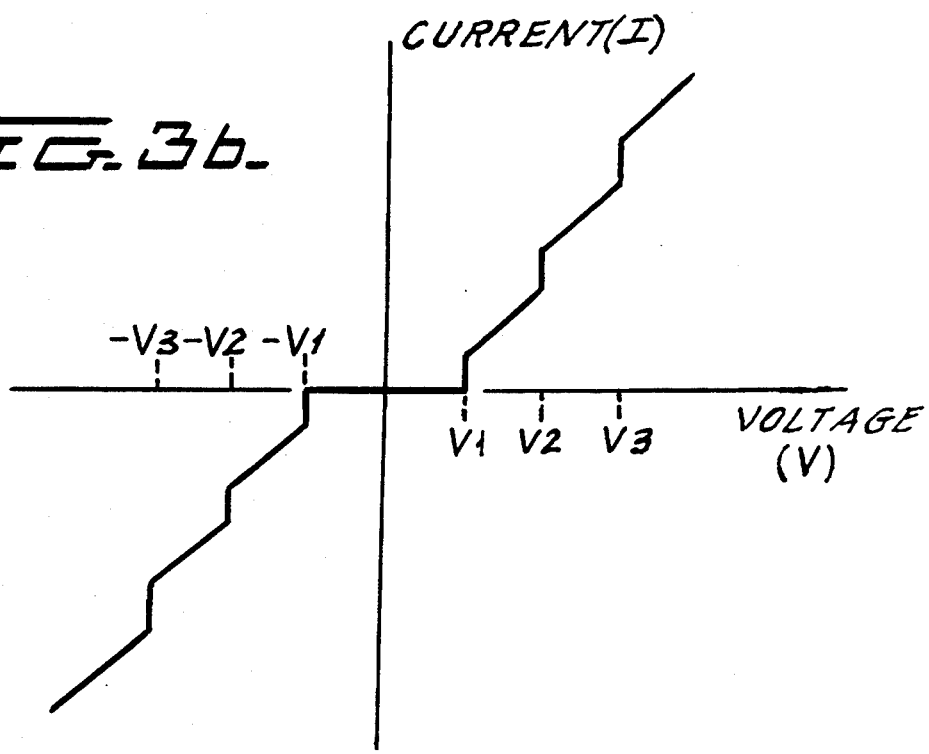
FIG. 3b shows the current-voltage (IV) characteristics of the device shown in FIG. 3 as the voltage source is varied from a negative voltage to a positive voltage.

In FIG. 3a the voltage source is equal to a non-zero value, i.e., Ec1>Ec2. The difference between Ec1 and Ec2 (Ec1−Ec2) is proportional to the battery voltage (V). The greater the battery voltage (V), the greater the "band bending" and the greater the difference Ec1−Ec2. FIG. 3a is drawn for some arbitrary voltage. FIG. 3b shows the current (I) flowing around the circuit as a function of the battery voltage. The current flows out of battery 24 through device 10 and back to battery 24. If device 10 was an ideal resistor, the IV curve would be a straight line. However, device 10 has a "stair step" shaped IV curve. An electron at energy Ec1 in electrode 12 tunnels through material 16 onto the carbon cluster 18, from cluster 18 the electron tunnels through material 16 to electrode 14 at an energy Ec2. However, cluster 18 is so small that when one (or more) electron(s) is on it, it develops a finite voltage due to its very small self capacitance. This means that for the first electron to be able to tunnel from electrode 12 to cluster 18, the voltage must be made large enough to overcome the voltage developed on cluster 18 due to its small self capacitance. Assuming that the battery voltage required to overcome the finite voltage developed due to one electron on the cluster is V1, V2 for two electrons, etc., when V<V1 a single electron on cluster 18 would develop more voltage than is applied to device 10. Therefore, it is not energetically possible for an electron to be on cluster 18, and hence no current flows when $0 \leq V \leq V1$. When V=V1 it is energetically possible for an electron to be on cluster 18, hence current starts to flow, resulting in the jump in the IV curve at V1.

When $V1 \leq V \leq V2$ a single electron can flow from electrode 12 onto cluster 18, and then from cluster 18 to electrode 14. Although a finite current (meaning many electrons per second) flows through device 10, only one electron at a time is on cluster 18. When V=V2 it is energetically possible for two electrons to be on cluster 18 at the same time, and a second increase in the current occurs. Since the device is symmetric, a similar result will occur for a battery voltage of opposite sign (−V) resulting in a negative current (−I), hence the IV curve is symmetric about V=0, as shown in FIG. 3b.

Figure 5:
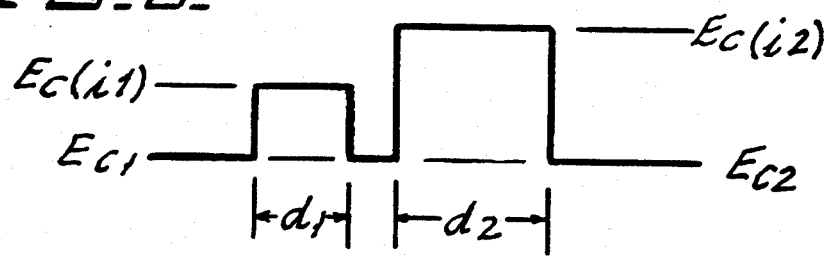
FIG. 5 shows the conduction band of the device of FIG. 4.

As mentioned above, device 10 is basically a double barrier tunnel structure. Such devices are used in a variety of applications. The structure of the basic device may be tailored to fit the particular application. It will be understood that a large number of alternatives to the structure described above are available. Referring to FIG. 4, the type of insulating material on each side of fullerene 18 can be different. By using different insulating materials 26, 28 the height of conduction band energy Ec(i1) of insulating material 26 can be different from the height of the conduction band energy Ec(i2) of insulating material 28. See FIGS. 4 and 5. Also, the thickness d1 of insulating material 26 can be different from the thickness d2 of insulating material 28. By using insulators 26, 28 having different thicknesses on each side of fullerene 18, the width of the energy barriers around fullerenes 18 are different.

It will be understood that fullerenes 18 can be chemically modified by placing atoms or molecules inside fullerene 18 or attaching atoms or molecules to the outside of fullerene 18. This will allow for control of the band gap of fullerene 18, and the conduction band line up of fullerene 18 with the surrounding insulating material 16 or 26 and 28.

It will be understood that while the energy level Ecf of fullerene 18 has been illustrated as the same as Ec1 and Ec2, this can be varied. Depending upon the material used for insulating material 16, the conduction band alignment of fullerene 18 and the surrounding material will differ. The preferred choice of materials depends upon the application. FIGS. 6a–6b illustrate various alternatives.

It is preferred that device 10 be located on a substrate 30 for mechanical support as shown in FIG. 7. Device 10 may be located on an electrically conductive substrate 32 (FIG. 8). In this case, substrate 32 serves as the electrical contact to one terminal of the device, and conductive layer 14 may be eliminated. Substrate 32 may be either metal or semiconductor material. Other suitable substrates materials will be apparent to one skilled in the art.

Fullerene 18 may be prepared by laser vaporization of a graphite substrate. Carbon may be vaporized from the surface of a solid disk of graphite into a flow of helium using a focused pulsed laser, for example, the second harmonic of a Nd:YAG laser producing pulse energies of approximately 30 mJ. The carbon clusters formed may be expanded using a supersonic molecular beam and photoionized using an excimer laser. Suitable processes for forming fullerenes 18 are taught by Rohlfing et al. and Kroto et al. which were mentioned above, both of which are herein incorporated by reference. The remainder of device 10 may be manufactured using any suitable technique which are all well known in electronic circuit manufacture.

Any suitable fullerene may be used in the invention. Preferably, the fullerene is $C_{60}$ because it is very stable and because it has been produced in large quantities. In general, the fullerene need only be of a fixed size and be stable enough for incorporation into an electronic device and yield a useful device lifetime. Known specific sizes of fullerenes that are stable enough to allow for observation in the laboratory are $C_{1-190}$, which have a bimodal cluster size distribution of (i) both even and odd clusters for $C_n$ where $1 \leq n \leq 30$, and (ii) only even clusters for $C_{2n}$ where $20 \leq n \leq 90$. See Rohlfing et al. mentioned above.

The present invention has several significant advantages over the prior art. Room temperature operation is possible. Device uniformity and very dense integrated circuits are possible because the devices are exceptionally small. The invention also reduces the required power consumption per device. Moreover, fabrication of larger amounts of fullerenes is easy, and they can be made from carbon which is a cheap and plentiful material. It is believed that the fullerenes will not contribute in any significant way to the cost of the device fabrication. It is possible to achieve very dense digital electronics in accordance with the invention, i.e., on the order of 100 billion devices per square centimeter. Devices in accordance with the invention also have very low noise. Direct current to frequency conversion is obtained, and the invention is useful in analog signal amplification with large voltage gain or large current gain, both with very large power gain.

Various changes and modifications can be made in the device of the present invention without departing from the spirit and scope thereof. The various embodiments which have been described herein were for the purpose of illustrating the invention but were not intended to limit it.

What is claimed is:

1. A solid state electronic device operable at room temperature using a single electron to convey information, comprising:
    first and second conductive layers;
    first and second leads connected to the first and second conductive layers, respectively;
    an insulating material located between the first and second conductive layers and a cluster of pure carbon atoms located in the insulating material;
    wherein a single electron tunnels during operation of the device from one of the conductive layers through a portion of the insulating material to the pure carbon cluster and then tunnels from the pure carbon cluster through another portion of the insulating material to the other conductive layer; and
    wherein the insulating material comprises first and second insulating materials, the first insulating material having a first conduction band energy and being located between the first conductive layer and the pure carbon cluster and the second insulating material having a second conduction band energy different from the first conduction band energy and being located between the pure carbon cluster and the second conductive layer.

2. The device of claim 1, wherein the pure carbon atom cluster is a layer of pure carbon atom clusters.

3. The device of claim 2, wherein each pure carbon atom cluster contains sixty carbon atoms.

4. The device of claim 2, wherein each carbon atom cluster has a truncated icosahedron structure including sixty vertices having thirty-two faces, twelve of the faces having a pentagonal shape and twenty of the faces having a hexagonal shape.

5. The device of claim 1, wherein the insulating material is selected from the group consisting of silicon dioxide, barium fluoride, magnesium fluoride and combinations thereof.

6. The device of 1, further comprising a substrate for mechanically supporting the device.

7. The device of claim 6, wherein the substrate is electrically conductive.

8. The device of claim 1, wherein the pure carbon atom cluster has a chemically modified structure with additional atoms to alter the energy band gap thereof to have an energy band gap different from that of pure carbon.

9. A solid state electronic device operable at room temperature using a single electron to convey information, comprising:
    first and second conductive layers;
    first and second leads connected to the first and second conductive layers, respectively;

an insulating material located between the first and second conductive layers and a cluster of pure carbon atoms located in the insulating material;

wherein a single electron tunnels during operation of the device from one of the conductive layers through a portion of the insulating material to the pure carbon cluster and then tunnels from the pure carbon cluster through another portion of the insulating material to the other conductive layer; and wherein the insulating material comprises first and second insulating materials, the first insulating material being located between the first conductive layer and the pure carbon cluster and the second insulating material being located between the pure carbon cluster and the second conductive layer, the amount of first insulating material being different from the amount of second insulating material so that the first insulating material and the second insulating material have different conduction band energies.

* * * * *